US012628354B2

(12) United States Patent
Badaroglu et al.

(10) Patent No.: US 12,628,354 B2
(45) Date of Patent: May 12, 2026

(54) PACKAGE DIES INCLUDING VERTICAL INTERCONNECTS FOR SIGNAL AND POWER DISTRIBUTION IN A THREE-DIMENSIONAL (3D) INTEGRATED CIRCUIT (IC) PACKAGE

(71) Applicant: QUALCOMM Incorporated, San Diego, CA (US)

(72) Inventors: Mustafa Badaroglu, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 560 days.

(21) Appl. No.: 18/171,428

(22) Filed: Feb. 20, 2023

(65) Prior Publication Data

US 2024/0282729 A1     Aug. 22, 2024

(51) Int. Cl.
*H01L 23/00* (2006.01)
*H01L 23/48* (2006.01)
(Continued)

(52) U.S. Cl.
CPC ............ *H10B 80/00* (2023.02); *H10W 20/20* (2026.01); *H10W 20/427* (2026.01); *H10W 70/65* (2026.01); *H10W 70/652* (2026.01); *H10W 72/07252* (2026.01); *H10W 72/07254* (2026.01); *H10W 72/227* (2026.01); *H10W 72/247* (2026.01); *H10W 72/922* (2026.01); *H10W 72/926* (2026.01); *H10W 72/942* (2026.01);
(Continued)

(58) Field of Classification Search
CPC ........................................................ H01L 24/06
See application file for complete search history.

(56) References Cited

U.S. PATENT DOCUMENTS 6,137,164 A * 10/2000 Yew ................... H01L 23/49816
257/774
9,349,703 B2 * 5/2016 Chiu ....................... H01L 24/24
(Continued)

OTHER PUBLICATIONS

International Search Report and Written Opinion for International Patent Application No. PCT/US2024/010625, mailed Jun. 12, 2024, 12 pages.
(Continued)

*Primary Examiner* — William A Harriston
(74) *Attorney, Agent, or Firm* — Withrow & Terranova, PLLC/Qualcomm Incorporated

(57) ABSTRACT

A 3D IC package includes a first package die having a first side coupled to a package substrate and a second side coupled to a second package die. The first package die includes vertical interconnects to provide interconnections between the second package die and the package substrate. The vertical interconnects each extend vertically between a first die contact on the first side of the first package die and a second die contact on the second side of the first package die. The second package die couples to the second die contacts of the first package die to form power and/or signal interconnects between the package substrate and the second package die. Horizontal interconnects in a distribution layer on the first side of the first package die distribute power and signals horizontally between the first die contacts and the vertical interconnects.

21 Claims, 10 Drawing Sheets

(51) Int. Cl.

| | |
|---|---|
| *H01L 23/528* | (2006.01) |
| *H10B 80/00* | (2026.01) |
| *H10W 20/20* | (2026.01) |
| *H10W 20/41* | (2026.01) |
| *H10W 70/65* | (2026.01) |
| *H10W 70/652* | (2026.01) |
| *H10W 72/00* | (2026.01) |
| *H10W 72/20* | (2026.01) |
| *H10W 72/90* | (2026.01) |
| *H10W 90/00* | (2026.01) |

(52) U.S. Cl.

CPC ........ *H10W 72/944* (2026.01); *H10W 90/722* (2026.01); *H10W 90/724* (2026.01)

(56) References Cited

U.S. PATENT DOCUMENTS

| | | | | |
|---|---|---|---|---|
| 9,368,450 | B1* | 6/2016 | Gu | H01L 23/5385 |
| 9,646,917 | B2* | 5/2017 | Katkar | H01L 23/481 |
| 9,711,465 | B2* | 7/2017 | Liao | H01L 24/20 |
| 11,302,650 | B2* | 4/2022 | Wu | H01L 25/16 |
| 2009/0008792 | A1* | 1/2009 | Ko | H01L 24/19 |
| | | | | 257/E23.174 |
| 2009/0322364 | A1* | 12/2009 | Mangrum | G01R 31/2889 |
| | | | | 324/757.02 |
| 2010/0078772 | A1 | 4/2010 | Robinson | |
| 2012/0187545 | A1* | 7/2012 | Khan | H01L 24/97 |
| | | | | 257/621 |
| 2013/0062761 | A1* | 3/2013 | Lin | H01L 21/565 |
| | | | | 257/737 |
| 2013/0210198 | A1* | 8/2013 | Lin | H01L 23/49822 |
| | | | | 438/126 |
| 2014/0048951 | A1* | 2/2014 | Lin | H01L 23/49827 |
| | | | | 257/774 |
| 2019/0259702 | A1 | 8/2019 | Jain | |
| 2019/0333829 | A1* | 10/2019 | Chen | H01L 22/34 |
| 2021/0134728 | A1* | 5/2021 | Rubin | H01L 21/4853 |
| 2021/0160999 | A1* | 5/2021 | Dogiamis | H05K 9/0037 |
| 2021/0242170 | A1 | 8/2021 | Dabral et al. | |
| 2021/0375711 | A1 | 12/2021 | Shen et al. | |
| 2022/0022315 | A1* | 1/2022 | Song | H05K 3/101 |
| 2022/0068778 | A1* | 3/2022 | Leslie | H01L 23/50 |
| 2022/0310411 | A1* | 9/2022 | Chen | H01L 21/6836 |
| 2022/0352089 | A1* | 11/2022 | Liu | H01L 23/562 |
| 2022/0359335 | A1* | 11/2022 | Shen | H01L 24/83 |
| 2023/0290694 | A1* | 9/2023 | Yang | H01L 23/481 |
| 2023/0317677 | A1* | 10/2023 | Song | H01L 23/5389 |
| | | | | 257/668 |
| 2023/0369168 | A1* | 11/2023 | Mao | H01L 21/568 |
| 2024/0038701 | A1* | 2/2024 | Kuo | H01L 25/105 |
| 2024/0332221 | A1* | 10/2024 | Ahn | H01L 23/49838 |

OTHER PUBLICATIONS

Agarwal, R. et al., "3D Packaging for Heterogeneous Integration," 2022 IEEE 72nd Electronic Components and Technology Conference (ECTC), May 31-Jun. 3, 2022, San Diego, CA, USA, IEEE, pp. 1103-1107.

AMD, "AMD 3D V-Cache™ Technology," available as early as Feb. 2023 from the Internet: [URL: https://www.amd.com/en/technologies/3d-v-cache], Advanced Micro Devices, Inc., 6 pages.

Mather, R. et al., "3D-Split SRAM: Enabling Generational Gains in Advanced CMOS," 2021 IEEE Custom Integrated Circuits Conference (CICC), Apr. 25-30, 2021, Austin, TX, USA, IEEE, 2 pages.

Munger, B. et al., "2.1 "Zen 4": The AMD 5nm 5.7GHz x86-64 Microprocessor Core," 2023 IEEE International Solid-State Circuits Conference (ISSCC), Feb. 19-23, 2023, San Francisco, CA, USA, IEEE, 2 pages.

Wuu, J. et al., "26.4 3D V-Cache: The Implementation of a Hybrid-Bonded 64MBStacked Cache for a 7nm x86-64 CPU," 2022 IEEE International Solid-State Circuits Conference (ISSCC), Feb. 20-26, 2022, San Francisco, CA, USA, IEEE, 38 pages.

* cited by examiner

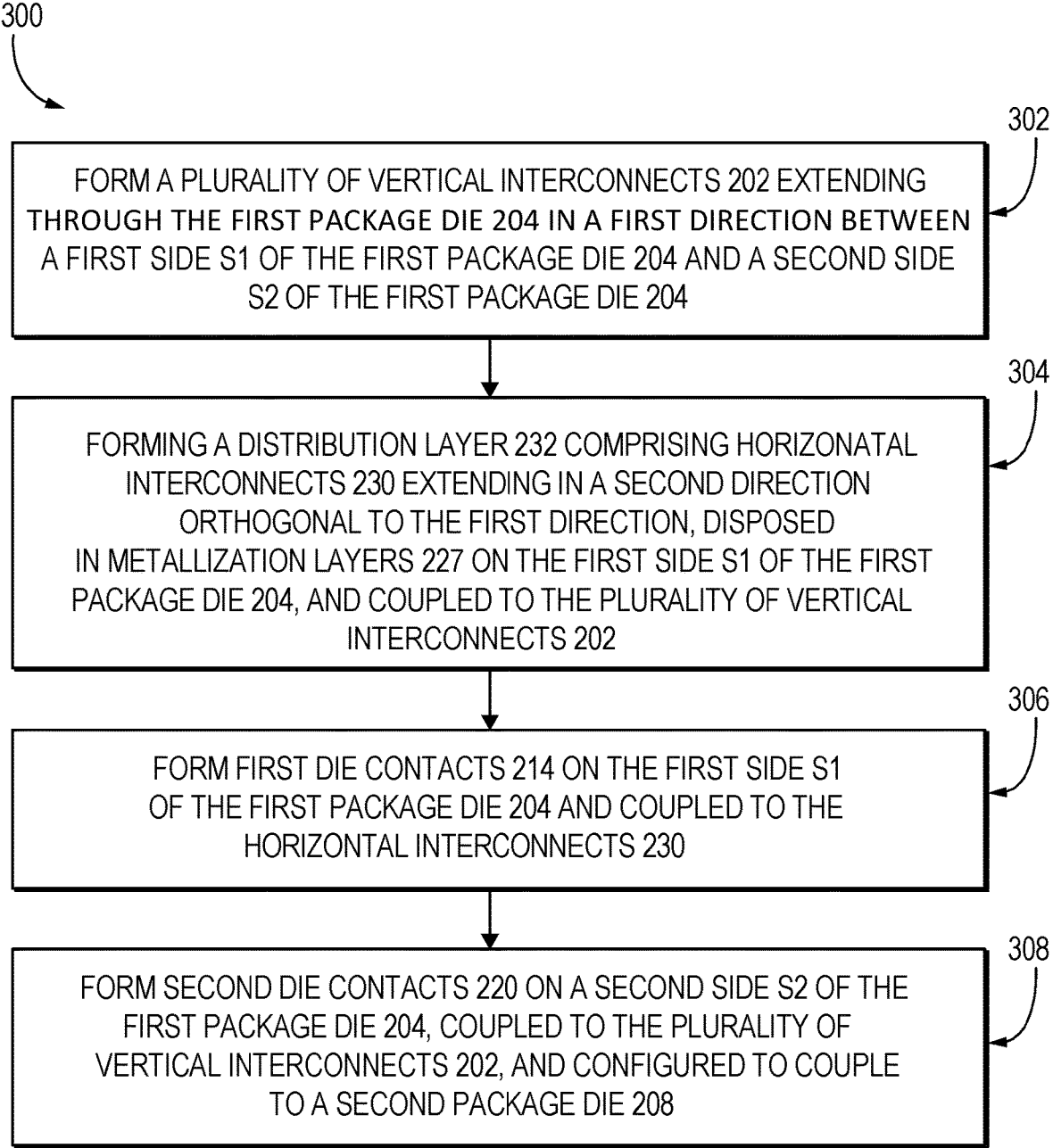

300

302

FORM A PLURALITY OF VERTICAL INTERCONNECTS 202 EXTENDING THROUGH THE FIRST PACKAGE DIE 204 IN A FIRST DIRECTION BETWEEN A FIRST SIDE S1 OF THE FIRST PACKAGE DIE 204 AND A SECOND SIDE S2 OF THE FIRST PACKAGE DIE 204

304

FORMING A DISTRIBUTION LAYER 232 COMPRISING HORIZONATAL INTERCONNECTS 230 EXTENDING IN A SECOND DIRECTION ORTHOGONAL TO THE FIRST DIRECTION, DISPOSED IN METALLIZATION LAYERS 227 ON THE FIRST SIDE S1 OF THE FIRST PACKAGE DIE 204, AND COUPLED TO THE PLURALITY OF VERTICAL INTERCONNECTS 202

306

FORM FIRST DIE CONTACTS 214 ON THE FIRST SIDE S1 OF THE FIRST PACKAGE DIE 204 AND COUPLED TO THE HORIZONTAL INTERCONNECTS 230

308

FORM SECOND DIE CONTACTS 220 ON A SECOND SIDE S2 OF THE FIRST PACKAGE DIE 204, COUPLED TO THE PLURALITY OF VERTICAL INTERCONNECTS 202, AND CONFIGURED TO COUPLE TO A SECOND PACKAGE DIE 208

FIG. 3

PDN
802B

PRIMARY CIRCUIT
BLOCKS
808

REGION
800B

PRIMARY
VERTICAL
INTERCONNECTS
810

PDN
802A

REGION
800A

SECONDARY
VERTICAL
INTERCONNECTS
806

SECONDARY
CIRCUIT BLOCKS
804

PACKAGE DIES INCLUDING VERTICAL INTERCONNECTS FOR SIGNAL AND POWER DISTRIBUTION IN A THREE-DIMENSIONAL (3D) INTEGRATED CIRCUIT (IC) PACKAGE

BACKGROUND

I. Field of the Disclosure

The technology of the disclosure relates generally to integrated circuit (IC) packages and, more specifically, to interconnecting dies in a three-dimensional (3D) IC package.

II. Background

Integrated circuits (ICs) provide functionality to many types of electronic devices, which include multiple ICs designed to work together. These ICs may be disposed horizontally adjacent to each other on a two-dimensional (2D) surface of a substrate or circuit board with horizontal metal interconnects extending on or in the substrate or circuit board between the ICs to provide die-to-die (D2D) connections. To save area and reduce the lengths of the metal interconnects, device manufacturers also provide IC packages that include multiple ICs stacked vertically to provide three-dimensional (3D) packages.

One of the challenges in fabricating 3D IC packages is that routing resources are needed for power and signal connections to a lower die as well as for vertical connections to an upper die. The vertical connections to the upper die extend from package interconnects on a bottom side of the lower die that connect to a package substrate to contacts on a top side of the lower die that connect to the upper die. Incorporating these vertical connections into the lower die requires a sacrifice of resources, and this problem is exacerbated if the preferred locations of the vertical connections conflict with densely packed logic areas of the lower die. Thus, there is a tradeoff between area efficiency of the lower die and having sufficient area through which to route vertical connections to distribute power and logic signals to the upper die.

SUMMARY

Aspects disclosed in the detailed description include a package die including vertical interconnects for signal and power distribution in a three-dimensional (3D) integrated circuit (IC) package. Related methods of fabricating package dies, including vertical interconnects, are also disclosed. A 3D IC package includes a first package die having a first side coupled to a package substrate disposed vertically below the first package die and a second side opposite to the first side and coupled to a second package die disposed vertically above and adjacent to the first package die. The first package die includes first die contacts disposed on the first side and coupled to the package substrate and second die contacts disposed on the second side and coupled to the second package die. The first package die, which is disposed vertically between the second package die and the package substrate, includes vertical interconnects to provide interconnections between the second package die and the package substrate. The vertical interconnects each extend vertically between a first die contact on the first side of the first package die and a second die contact on the second side of the first package die. Third die contacts on a third side of the second package die couple to the second die contacts of the first package die to provide power and/or signal interconnects between the package substrate and the second package die. In exemplary aspects, horizontal interconnects distribute the power and signals horizontally between the first die contacts and the vertical interconnects. The horizontal interconnects may be provided in a distribution layer to provide a low resistance path and avoid an increase in congestion that would be caused by routing the power and signals through metallization layers on the first package die. In some examples, locations of the vertical interconnects are selected to avoid interference with circuit blocks on the first package die and to distribute power among the second die contacts, which may couple to a power distribution network in the second package die.

In this regard, in one aspect, a 3D IC package is disclosed. The 3D IC package includes a first package die. The first package die includes a plurality of vertical interconnects extending through the first package die in a first direction between a first side of the first package die and a second side of the first package die. The first package die also includes a distribution layer comprising horizontal interconnects extending in a second direction orthogonal to the first direction. The distribution layer is disposed on metallization layers on the first side of the first package die and coupled to the plurality of vertical interconnects. The first package die also includes first die contacts disposed on the first side of the first package die and coupled to the horizontal interconnects. The first package die also includes second die contacts disposed on the second side of the first package die, coupled to the plurality of vertical interconnects, and configured to couple to a second package die.

In another aspect, a method of fabricating a 3D IC package is disclosed. The method includes forming a plurality of vertical interconnects extending through the first package die in a first direction between a first side of the first package die and a second side of the first package die. The method also includes forming a distribution layer comprising horizontal interconnects extending in a second direction orthogonal to the first direction. The distribution layer is disposed on metallization layers on the first side of the first package die and coupled to the plurality of vertical interconnects. The method also includes forming first die contacts disposed on the first side of the first package die and coupled to the horizontal interconnects. The method also includes forming second die contacts disposed on the second side of the first package die, coupled to the plurality of vertical interconnects, and configured to couple to a second package die.

BRIEF DESCRIPTION OF THE DRAWINGS

FIG. 3 is a flow chart of a method for fabricating the first package die of the 3D IC package, as shown in FIGS. 1 and 2;

DETAILED DESCRIPTION

Figure 1:
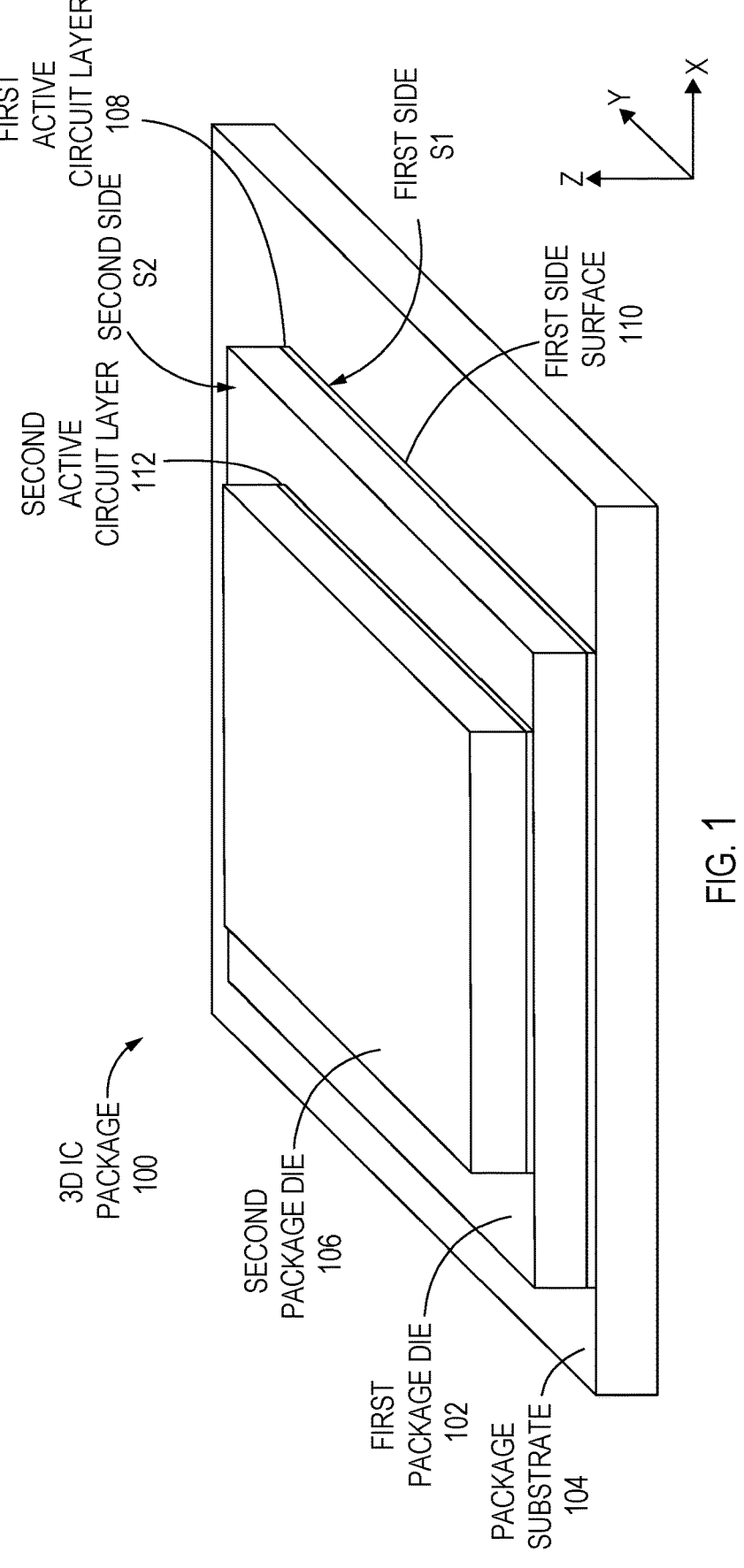
FIG. 1 is a perspective view of a three-dimensional (3D) integrated circuit (IC) package, including an exemplary first package die disposed between a package substrate and a second package die and comprising vertical interconnects for power and signal distribution with reduced metal layer congestion.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a package die including vertical interconnects for signal and power distribution in a three-dimensional (3D) integrated circuit (IC) package. Related methods of fabricating package dies, including vertical interconnects, are also disclosed. A 3D IC package includes a first package die having a first side coupled to a package substrate disposed vertically below the first package die and a second side opposite to the first side and coupled to a second package die disposed vertically above and adjacent to the first package die. The first package die includes first die contacts disposed on the first side and coupled to the package substrate and second die contacts disposed on the second side and coupled to the second package die. The first package die, which is disposed vertically between the second package die and the package substrate, includes vertical interconnects to provide interconnections between the second package die and the package substrate. The vertical interconnects each extend vertically between a first die contact on the first side of the first package die and a second die contact on the second side of the first package die. Third die contacts on a third side of the second package die couple to the second die contacts of the first package die to provide power and/or signal interconnects between the package substrate and the second package die. In exemplary aspects, horizontal interconnects distribute the power and signals horizontally between the first die contacts and the vertical interconnects. The horizontal interconnects may be provided in a distribution layer to provide a low resistance path and avoid an increase in congestion that would be caused by routing the power and signals through metallization layers on the first package die. In some examples, locations of the vertical interconnects are selected to avoid interference with circuit blocks on the first package die and to distribute power among the second die contacts, which may couple to a power distribution network in the second package die.

In this regard, FIG. 1 is a three-dimensional (3D) integrated circuit (IC) package 100, including an exemplary first package die 102 that is coupled, on a first side S1, to a package substrate 104 and, on a second side S2, to a second package die 106. The first package die 102 includes vertical interconnects (see FIG. 2) that each include vias extending between the package substrate 104 and the second package die 106 for improved power distribution and reduced metal layer congestion. The first package die 102, includes a first active circuit layer 108 in which circuit blocks (not shown), including transistor circuits, provide functions such as data and instruction processing and/or data storage. The term "circuit block" indicates circuits interconnected to provide a function, for example, where the circuits may be densely arranged. The term "block" is not intended to indicate any particular shape (i.e., not necessarily square or rectangular). The first package die 102 may be coupled to external circuits (not shown) through the package substrate 104. In some examples, as shown below, first die contacts are distributed (e.g., in one or more arrays) on a first side surface 110 on the first side SI of the first package die 102 and may be coupled to the package substrate 104 by solder balls or solder bumps (not shown), or other appropriate means known in the art.

The second package die 106 includes a second active circuit layer 112 that may provide a function that interacts closely with function(s) provided in the first active circuit layer 108 of the first package die 102. Thus, vertically stacking (e.g., three-dimensionally) the second package die 106 on the first package die 102, rather than disposing the first and second package dies 102, 106 in a laterally adjacent relationship (e.g., side-by-side) on the package substrate 104, reduces an area of the package substrate 104 occupied by the first and second package dies 102, 106, and also reduces a propagation distance for signals and power transmitted between the first active circuit layer 108 of the first package die 102 and the second active circuit layer 112 of the second package die 106. In some examples, the first active circuit layer 108 and the second active circuit layer 112 may include circuit blocks, including logic circuits (e.g., digital logic circuits) for data processing and memory array circuits for data storage, respectively. Storing data in memory array circuits in close proximity to processing circuits that process the data reduces data access latency, which can improve processing performance.

In FIG. 1, the second package die 106 is stacked on the first package die 102, such that the second package die 106 is above the first package die 102 in a vertical (e.g., Z-axis) direction. In this regard, the second package die 106 may also be referred to as an upper package die 106, while the first package die 102 may be referred to as a lower package die 102. As noted, the first (lower) package die 102 is coupled to the package substrate 104 through the first die contacts (not shown) disposed on the first side surface 110 on the first side S1. The first active circuit layer 108 may be coupled to the second package die 106 by second die contacts (not shown) on the second side S2 of the first package die 102. The second package die 106 may also send and/or receive control and/or data signals to/from circuits external to the first package die 102. Power must also be provided to both the second package die 106 and the first package die 102 from the package substrate 104. In some examples, the second package die 106 may have greater power demands than the first package die 102. Thus, a problem for designers of 3D IC package 100 lies in providing adequate power to the upper package die 106 from the package substrate 104.

In a 3D IC package including a memory die and processor die, the number of vertical interconnects between the package substrate 104 and the upper package die 106 could be minimized by putting processing circuits in the lower package die 102 closer to the package substrate 104, because the processing circuits consume more power than memory array circuits, in general. In this regard, the memory array circuits would be disposed in the upper package die 106. However, such configuration makes it difficult for the heat generated in the processing circuits to be efficiently dissipated. The alternative configuration, in which the upper package die 106 contains the processing circuits, and the lower package die 102 contains the memory array circuits. However, there still exists the problem of providing sufficient vias for the signal and high power requirements of the processing circuits in the upper package die 106 without significant negative impacts on the lower package die 102. Exemplary aspects of the first package die 102 in the 3D IC package are illustrated in FIG. 2.

Figure 2:
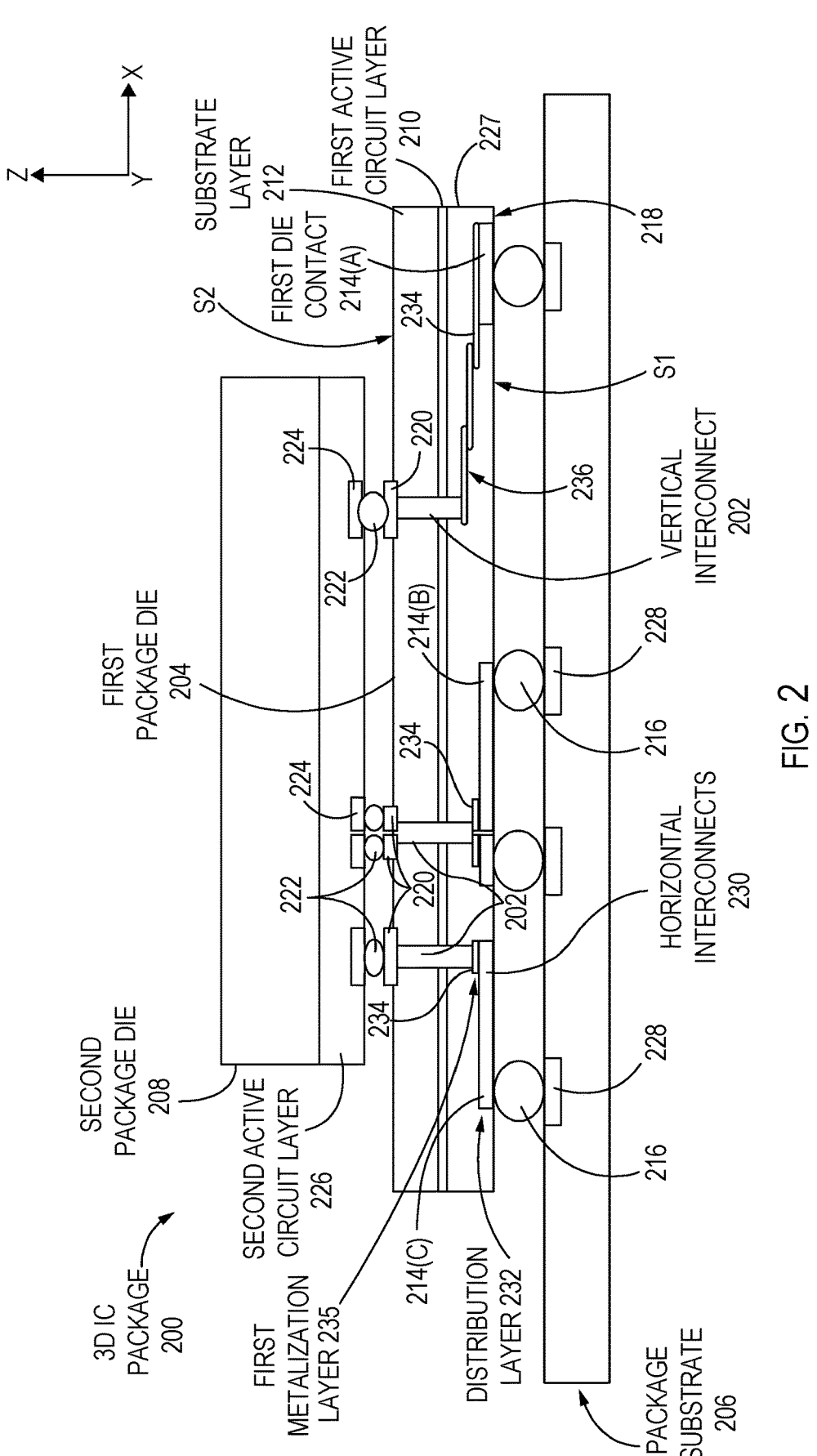
FIG. 2 is a cross-sectional side view of the 3D IC package in FIG. 1, showing the vertical interconnects extending through the first package die and interconnecting first die contacts to second die contacts.

FIG. 2 is a cross-sectional side view of a 3D IC package 200, which may be the 3D IC package 100 in FIG. 1. Features of the 3D IC package 200 include those corresponding to the 3D IC package 100 discussed above and additionally include exemplary vertical interconnects 202 in the first package die 204 for vertically coupling a package substrate 206 to a second package die 208. The first package die 204, includes a first active circuit layer 210, including circuit blocks (not shown), such as transistor circuits that may include processing circuits (logic circuits), memory array circuits, and analog circuits, for example. The first active circuit layer 210 is disposed on a substrate layer 212 and on a first side S1 of the first package die 204. The substrate layer 212 may be a semiconductor substrate, such as silicon, although another type of semiconductor substrate is possible. In another example, the substrate layer 212 may include at least one layer of other material(s) in addition to a semiconductor. The vertical interconnects 202, illustrated in more detail below, include one or more vias (not shown here). For this reason, the vertical interconnects 202 may be referred to as "cluster through-silicon-vias" ("cluster TSVs"). The vertical interconnects 202 extend through the first package die 204 from the first side S1 to a second side S2 in a direction orthogonal to the first active circuit layer 210 (e.g., Z-axis direction).

The 3D IC package 200 includes the package substrate 206 on the first side S1 of the first package die 204. The package substrate 206 may be a laminate, a printed circuit board (PCB), an interposer, a module substrate, or a semiconductor substrate, for example. The first package die 204 includes first die contacts 214(A)-214(C) that couple to the package substrate 206. Although only first die contacts 214(A)-214(C) are shown in the cross-sectional view in FIG. 2, it should be understood that the first die contacts 214(A)-214(C) are merely a few instances of a plurality of first die contacts 214. In this example, the plurality of first die contacts 214 are coupled to the package substrate 206 through solder balls or bumps 216, but another type of package interconnects may be employed. The plurality of first die contacts 214 may be disposed in one or more arrays of contacts on a first side surface 218 on the first side S1 of the first package die 204. In this manner, the first package die 204 is disposed in a face-down orientation with the first active circuit layer 210 opposite to (e.g., facing) the package substrate 206 and interconnected with the package substrate 206 through the plurality of first die contacts 214. This may be referred to as flip-chip bonding.

The second package die 208 is coupled to second die contacts 220 on the second side S2 of the first package die 204. The second die contacts 220 are coupled to the vertical interconnects 202. The vertical interconnects 202 extend through the first package die 204 between the first side S1 and the second side S2 in a direction orthogonal to the first active circuit layer 210 (e.g., Z-axis direction), which is a vertical direction in FIG. 2. The second die contacts 220 on the first package die 204 are coupled to a second active circuit layer 226 of the second package die 208 by way of additional solder bumps or balls 222, or another type of interconnect, disposed between the second die contacts 220 on the first package die 204. The solder bumps 222 connect to third die contacts 224 on the second package die 208, and the third die contacts 224 are coupled to the second active circuit layer 226, which may include transistor circuits providing logic functions, processing functions, or memory functions, for example. In some examples, the first active circuit layer 210 of the first package die 204 comprises circuit blocks, including memory array circuits and the second active circuit layer 226 of the second package die 208 includes logic circuits, such as processing circuits of a processor. Having the first package die 204, containing memory array circuits beneath, rather than on top of, the second package die 208, allows better heat dissipation from the high power-consuming processing circuits.

Signals and power are provided to the second package die 208 through the second die contacts 220 by way of the vertical interconnects 202. More specifically, the second die contacts 220 couple to vias (not shown) included within the vertical interconnects 202. Some of the vertical interconnects 202 (e.g., the vias) electrically couple to the package substrate 206 through the plurality of first die contacts 214, while other vertical interconnects 202 may couple, instead, to the first active circuit layer 210 in the first package die 204. In this manner, control signals and data signals, for example, may be transferred directly between processing circuits in the second package die 208 and memory array circuits in the first package die 204 without also passing through the first die contacts 214 and down to the package substrate 206. Power and other signals may be passed directly between the package substrate 206 and the second package die 208 without also being coupled to the first active circuit layer 210 on the first package die 204. Vias in the vertical interconnects 202 may couple the second active circuit layer 226 to only the first active circuit layer 210, to only the package substrate 206, or to both the first active circuit layer 210 and the package substrate 206.

The vertical interconnects 202 extend through metallization layers 227 disposed on the first active circuit layer 210. The metallization layers 227 may be disposed on the first active circuit layer 210 in a back end of line (BEOL) process. Each of the vertical interconnects 202 includes at least one, and up to several (e.g., seven or more) vias, which are electrical conductors extending through the vertical interconnects 202 insulated from the first active circuit layer 210, from the substrate layer 212, and from each other. The vertical interconnects 202 are further coupled to the plurality of first die contacts 214. However, as shown in the examples in FIGS. 1 and 2, the first package die 204 and the second package die 208 may have different dimensions in the horizontal direction (e.g., in planes extending in the X-axis direction and the Y-axis direction, parallel to the package substrate 206). For at least this reason, the plurality of first die contacts 214 that are coupled to the package substrate 206 may be distributed in a different pattern, at a different pitch, and/or over a different-sized area than the vertical interconnects 202 that couple to the second die contacts 220.

Due to the plurality of first die contacts 214 being offset horizontally from the second die contacts 220, the vertical interconnects 202 may be aligned with the second die contacts 220 but not with the plurality of first die contacts 214. On the first side S1 of the first package die 204, there are multiple vias in the vertical interconnects 202, and each of the vias couples to a different one of the plurality of first die contacts 214, which are offset horizontally (e.g., in the X-axis direction and/or the Y-axis direction) from the vertical interconnect 202 through which the vias extend.

FIG. 2 is provided to show that, in a first exemplary aspect, horizontal interconnects 230 couple the plurality of first die contacts 214 horizontally to vias in the vertical interconnects 202. The horizontal interconnects 230 are formed in a distribution layer 232 of the metallization layers 227 on the first active circuit layer 210. The distribution layer 232 may also be referred to as a redistribution layer (RDL) in some examples. The distribution layer 232 is disposed in the metallization layers 227 on the first active circuit layer 210, and the horizontal interconnects 230 are coupled to the vertical interconnects 202. The plurality of first die contacts 214 are also disposed on the first active circuit layer 210 and coupled to the horizontal interconnects 230. The plurality of first die contacts 214 may be portions of the horizontal interconnects 230 in the distribution layer 232. Alternatively, the plurality of first die contacts 214 may be contact pads (not shown) formed separately from the horizontal interconnects 230 but coupled to the horizontal interconnects 230, for example.

In some examples, the distribution layer 232 is the outermost metal layer in the metallization layers 227 formed on the first active circuit layer 210. In other words, the distribution layer 232 is farther from the first active circuit layer 210 than the other metallization layers 227. The horizontal interconnects 230 formed in the distribution layer 232 may have a large cross-section that provides a low resistance path for power and signal transmission. For power transmission, the horizontal interconnects 230 may couple to a vertical interconnect 202 by way of a metal trace 234 (e.g., wire) formed in a first metallization layer 235 (of the metallization layers 227), which also provides a low resistance path. The first metallization layer 235 is adjacent to the distribution layer 232. The distribution layer 232 and first metallization layer 235 are shown on the bottom side (in the Z-axis direction) of the first package die 204 in FIG. 2 because the first package die 204 is inverted for flip-chip bonding to the package substrate 206.

In some examples, the vertical interconnects 202 extend in a first direction (e.g., the Z-axis direction, the horizontal interconnects 230 extend in a second direction (e.g., the X-axis direction) orthogonal to the vertical interconnects 202, and the metal traces 234 extend in a third direction (e.g., the Y-axis direction) orthogonal to the horizontal interconnects 230 and the vertical interconnects 202. Together, the horizontal interconnects 230 and the metal traces 234 provide a low resistance horizontal offset between the plurality of first die contacts 214 and the vertical interconnects 202. Employing the horizontal interconnects 230 in the distribution layer 232 and the metal traces 234 of the metallization layers 227, instead of lower layers of the metallization layers 227, avoids increasing congestion in the metallization layers 227 used for circuit interconnection in the first active circuit layer 210.

Since transmission of data signals and control signals does not typically involve the higher current levels needed for power transmission, the horizontal interconnects 230 used to transmit such control, and data signals may be coupled to smaller metal traces 236 in the metallization layers 227, such as those between the first metallization layer 235 and the first active circuit layer 210. Thus, the smaller metal traces 236 may be used for communication directed to the first package die 204 or for data and control signals directed to a vertical interconnect 202 to the second package die 208. In some examples, the vertical interconnects 202 extend between the second die contacts 220 and another metallization layer between the first metallization layer 235 and the first active circuit layer 210.

Fabrication processes can be employed to fabricate a 3D IC package that includes a first package die 204 with vertical interconnects 202 coupled between first die contacts 214 on a first side S1 and second die contacts 220 on a second side S2 and configured to transmit power and/or logic signals with low resistance and minimal impact to metallization congestion of the first package die 204, as shown in FIG. 2 and according to, but not limited to, any of the exemplary fabrication processes 300 in FIG. 3. In this regard, FIG. 3 is a flowchart illustrating an exemplary fabrication process 300 of fabricating a 3D IC package 200 including a first package die 204 including vertical interconnects 202 coupled between the first die contacts 214 on the first side S1 and the second die contacts 220 on the second side S2 in FIG. 2. In this regard, an exemplary method includes forming a plurality of vertical interconnects 202 extending through the first package die 204 in a first direction between a first side S1 of the first package die 204 and a second side S2 of the first package die 204 (block 302). The method further includes forming a distribution layer 232 comprising horizontal interconnects 230 extending in a second direction orthogonal to the first direction and disposed in metallization layers 227 on the first side S1 of the first package die 204 and coupled to the plurality of vertical interconnects 202 (block 304). The method also includes forming first die contacts 214 on the first side S1 of the first package die 204 and coupled to the horizontal interconnects 230 (block 306) and forming second die contacts 220 on the second side S2 of the first package die 204, coupled to the plurality of vertical interconnects 202, and configured to couple to a second package die (block 308).

Figure 4:
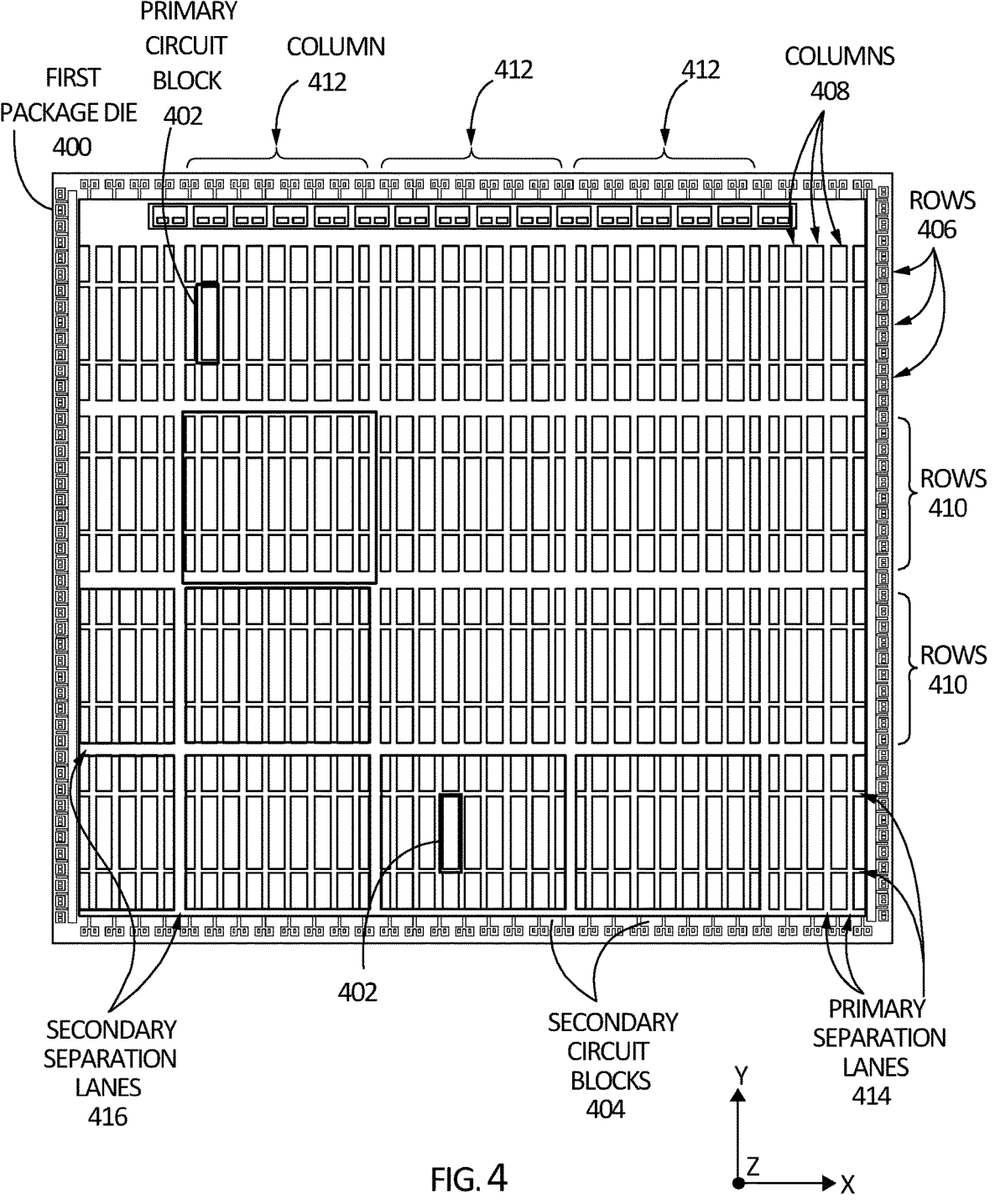
FIG. 4 is a plan view of one example of the first package die in FIG. 2, including vertical interconnects disposed in separation lanes between circuit blocks in an active circuit layer and first die contacts disposed in a non-overlap region of the first package die.

FIG. 4 is a plan view of one example of a first package die 400 corresponding to the first package dies 102, 204 of FIGS. 1 and 2. FIG. 4 is provided to show details that facilitate a description (in reference to FIG. 5) of the exemplary placement of vertical interconnects, as shown in FIG. 2. In this example, the first package die 400, includes a plurality of primary circuit blocks 402, which are memory array circuits in this example and, more particularly, may be static random access memory (SRAM) array circuits and/or dynamic random-access memory (DRAM) array circuits. The primary circuit blocks 402 (memory arrays) may be logically grouped and coupled together to form a plurality of secondary circuit blocks 404, which function as a memory array having a larger capacity of contiguous memory. In this regard, the primary circuit blocks 402 may be organized in a hierarchy. The primary circuit blocks 402 are the smallest memory arrays formed as an array of memory circuits in rows and columns (e.g., rectangular arrays). Addressing and data control circuits may be arranged to control a number of the primary circuit blocks 402, such that secondary circuit blocks 404 each operate as a single larger array.

In the layout of the first package die 400, the primary circuit blocks 402 are arranged in rows 406 and columns 408 within each of the secondary circuit blocks 404, and the secondary circuit blocks 404 are also arranged in rows 410 and columns 412. The secondary circuit blocks 404 include the primary circuit blocks 402 in the rows 406 and columns 408, which are spaced apart by primary separation lanes 414. Thus, the primary separation lanes 414 may extend in both the Y-axis direction and the X-axis direction. Similarly, the first package die 400 includes secondary separation lanes 416 between the rows 410 and the columns 412 of secondary circuit blocks 404. The secondary separation lanes 416 also extend in both the Y-axis direction and the X-axis direction. The primary separation lanes 414 are narrower in width than the secondary separation lanes 416.

The primary separation lanes 414 and the secondary separation lanes 416 provide spaces through which array interconnects (not shown) may be routed, and multiplexing circuitry may be placed. The primary and secondary separation lanes 414, 416 are less occupied (e.g., have more unused space) than the primary and secondary circuit blocks 402, 404 and, for this reason, provide desirable locations for vertical interconnects (not shown) to extend vertically through the active circuit layer, as described in more detail with reference to FIG. 5.

In the example of the first package die 400, the primary circuit blocks 402 are memory array circuits, but it should be understood that the primary circuit blocks 402 may also be logic circuits, such as processing circuits, for example, or other circuits. Regardless of circuit type, the primary circuit blocks 402 may be spaced apart by primary separation lanes 414 and may be organized hierarchically, such that secondary circuit blocks 404 may be arranged and spaced by wider secondary separation lanes 416.

Figure 5:
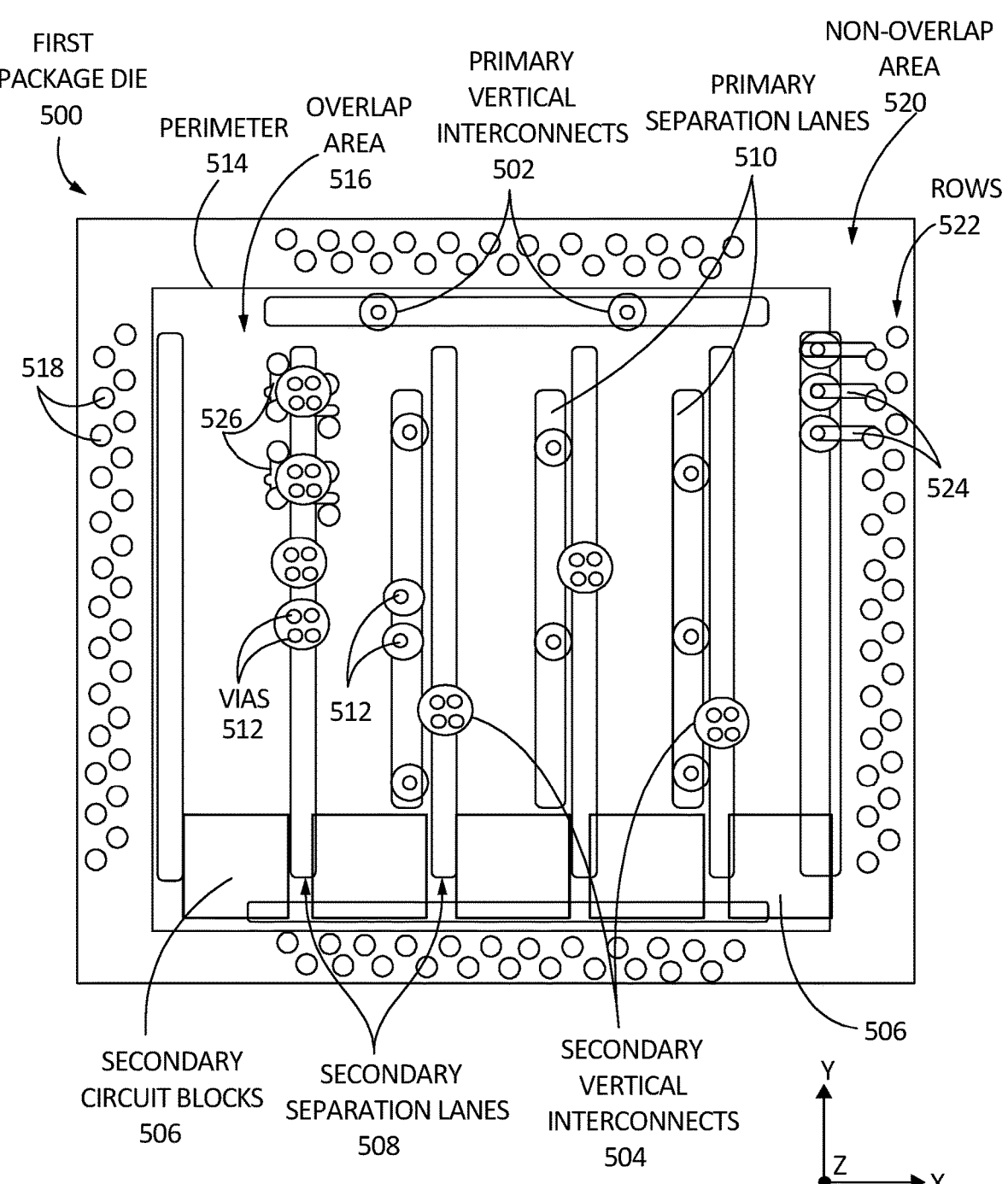
FIG. 5 is a plan view of one example of the first package die of FIGS. 1, 2, and 4, including circuit blocks of memory blocks of memory arrays interconnected in a hierarchy and spaced apart by separation lanes.

FIG. 5 is a top-down plan view of a first package die 500, which may be any of the first package dies 102, 204, 400 in FIGS. 1, 2, and 4. FIG. 5 is provided to illustrate the placement of vertical interconnects, including primary vertical interconnects 502 and secondary vertical interconnects 504, extending vertically (e.g., in the Z-axis direction) through the first package die 500 in a manner that avoids interference with circuit blocks and avoids causing significant increases in routing congestion. The first package die 500, includes secondary circuit blocks 506, which correspond to the secondary circuit blocks 404 in FIG. 4. To reduce clutter, only the secondary circuit blocks 506 are shown in FIG. 5, but it should be recognized that each of the secondary circuit blocks 506 is representative of one of the columns 412 extending in the Y-axis direction in FIG. 4. FIG. 5 shows the secondary separation lanes 508 that extend between the secondary circuit blocks 506 in the Y-axis direction. Though no primary circuit blocks are shown in FIG. 5, a few examples of primary separation lanes 510 are shown extending in the Y-axis direction. Based on FIG. 4, it should be recognized that the primary separation lanes 510 and the secondary separation lanes 508 extend in both the Y-axis direction and the X-axis direction, even though only examples extending in the Y-axis direction are shown in FIG. 5.

It should also be recognized that the primary and secondary separation lanes 510, 508 are not shown to scale in FIG. 5. In practice, the secondary separation lanes 508 are wider (e.g., in the X-axis or Y-axis direction) than the primary separation lanes 510, as shown in FIG. 4. Thus, the secondary separation lanes 508 have more space in which vertical interconnects 502, 504 may be added without interfering with the secondary circuit blocks 506 on either side. On the other hand, the primary separation lanes 510, though narrower, are provided in greater numbers and are closer together than the secondary separation lanes 508. Thus, many more locations may be available for primary vertical interconnects 502 to extend through the primary separation lanes 510 and at a more even distribution than the secondary vertical interconnects 504 in the secondary separation lanes 508. In some examples, the primary vertical interconnects 502 may also extend through the secondary separation lanes 508.

As noted above, the primary vertical interconnects 502, and the secondary vertical interconnects 504 may be cluster TSVs that each include a plurality of vias 512. In some examples, the primary vertical interconnects 502 may include less than four vias 512, and the secondary vertical interconnects 504 include at least four (4) (up to seven or more) vias 512. In this regard, the secondary vertical interconnects 504 extending through the secondary separation lanes 508 may provide larger numbers of vias 512 but at a coarser granularity (larger pitch), whereas the primary vertical interconnects 502 extending through the primary separation lanes 510 provide smaller numbers of the vias 512 but in a finer granularity (e.g., smaller pitch).

In FIG. 5, a perimeter 514 extends around an overlap area 516 in which a second package die (not shown), corresponding to the second package die 208 in FIG. 2, overlaps the first package die 500 because the second package die 208 may be smaller in area than the first package die 500. The overlap area 516 is where the second package die may be positioned opposite to (e.g., overlapping) the first package die 500 in the Z-axis direction. Referring here to FIG. 2, second die contacts 220 on the second side S2 (e.g., top side) of the first package die 204, 500 are disposed within the overlap area 516 in order to couple to corresponding third die contacts 224 on the second active circuit layer 226 of the second package die 208. The primary vertical interconnects 502 and the secondary vertical interconnects 504 each align vertically with one of the second die contacts (not shown in FIG. 5), so they must be located in the overlap area 516. Since the primary vertical interconnects 502 and the secondary vertical interconnects 504 are not required to align vertically with first die contacts 518, some of the first die contacts 518 may be disposed in a non-overlap area 520 of the first package die 500, which is outside the overlap area 516. In this regard, a row 522 of primary vertical interconnects 502 may be disposed in the overlap area 516 along the perimeter 514, and horizontal interconnects 524 (and/or metal traces 526) couple the primary vertical interconnects 502 to the first die contacts 518 in the non-overlap area 520.

FIG. 5 also shows examples of horizontal interconnects 524 and metal traces 526 extending from the primary and secondary vertical interconnects 502, 504 in the overlap area 516 to the first die contacts 518. The horizontal interconnects 524 may extend in either the X-axis direction or the Y-axis direction, with the metal traces 526 extending orthogonal to the horizontal interconnects 524. The distribution and number of each of the primary and secondary vertical interconnects 502, 504 may depend on several factors, including the organization of circuit blocks (e.g., memory arrays) in the first package die 500, the total amount of power consumed by the second package die, and the distribution of power consumption in the second package die.

Figure 6:
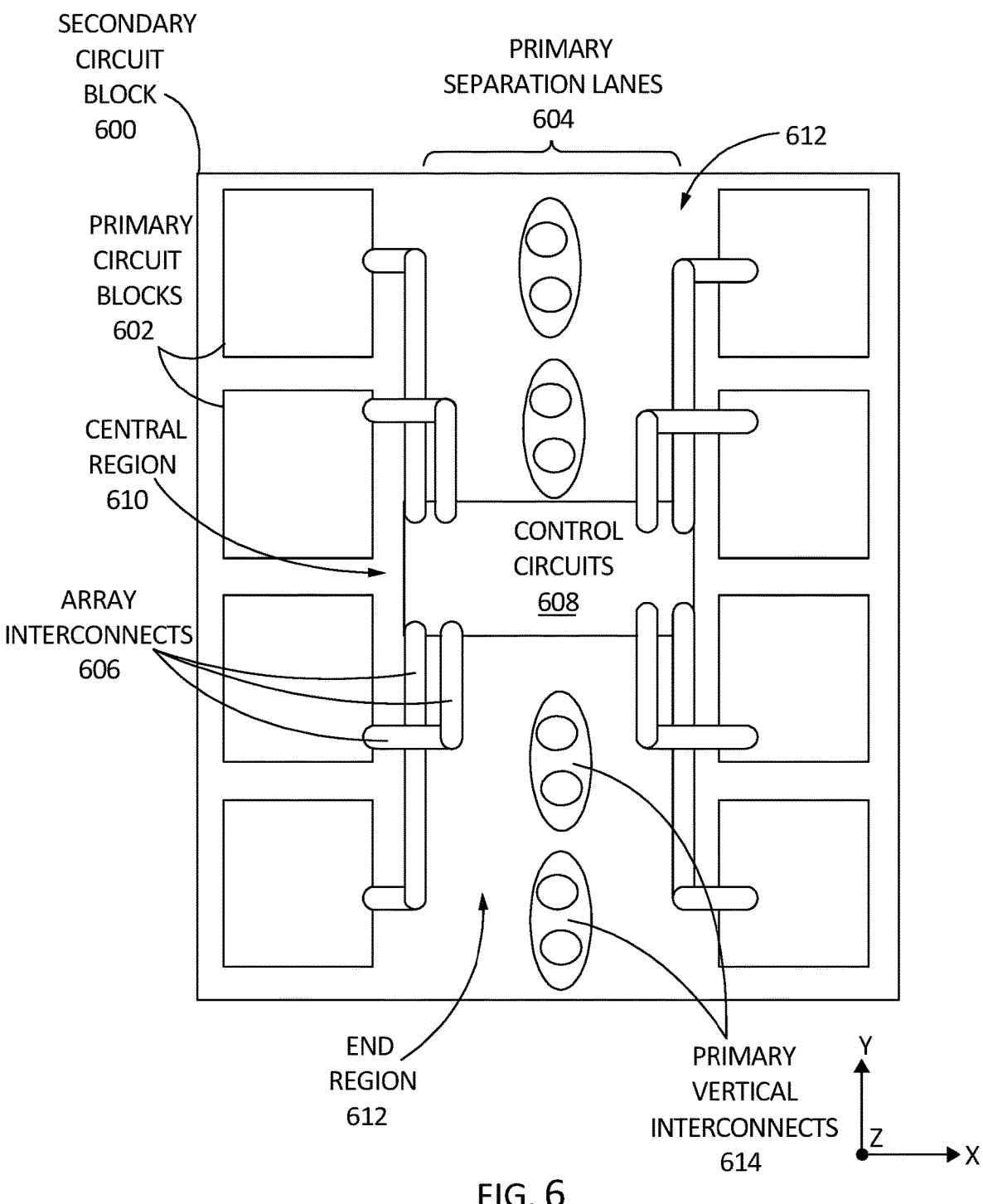
FIG. 6 is a plan view of a primary circuit block, including memory arrays disposed in columns on either side of a separation lane and array interconnects directed primarily to control circuits in a central portion of the separation lane, allowing edge-centric vertical interconnects to pass through each end portion of the separation lane without interfering with the primary circuit block.

FIG. 6 is a plan view of a secondary circuit block 600 corresponding to the secondary circuit blocks 404 and 506 in FIGS. 4 and 5, respectively, including primary circuit blocks 602 disposed on either side of a primary separation lane 604. In the example in FIG. 6, the primary circuit blocks 602 are memory array circuits interconnected to form the secondary circuit block 600 (memory array circuit), having the combined storage capacity of the primary circuit blocks 602. The secondary circuit block 600 includes array interconnects 606, which may carry data, address, clocking, and control signals. In addition, the secondary circuit block 600 includes control circuits 608 (e.g., address and data multiplexing circuits) for selecting one or more of the primary circuit blocks 602 for access (e.g., read or write) based on a memory address and directing data to/from the selected primary circuit block 602. The control circuits 608 are located in a central region 610 of the primary separation lane 604 of the secondary circuit block 600 to optimize timing to the respective primary circuit blocks 602. The central region 610 is central in the Y-axis direction in the primary separation lane 604. The array interconnects 606 also extend between the control circuits 608 in the central region 610 (e.g., in the Y-axis direction) and end regions 612 of the primary separation lane 604. Consequently, the end regions 612 have a much lower density of control circuits 608 and array interconnects 606 than the central region 610. Since these end regions are relatively unoccupied spaces, there is space for primary vertical interconnects 614 to pass vertically (e.g., in the Z-axis direction) between the primary circuit blocks 602 and through the secondary circuit block 600 without impacting the placement of the primary circuit blocks 602, control circuits 608, and/or array interconnects 606. The primary vertical interconnects 614 extend through the end regions 612 but do not extend through the central region 610 between the end regions 612. Positioning the primary vertical interconnects 614 in the end regions 612 of the primary separation lanes 604 may be referred to as "edge-centric" placement of the primary vertical interconnects 614. In view of the number and placement of primary separation lanes 414 in FIG. 4, which correspond to the primary separation lanes 604, the primary vertical interconnects 614 may be distributed across the first package die.

Figure 7:
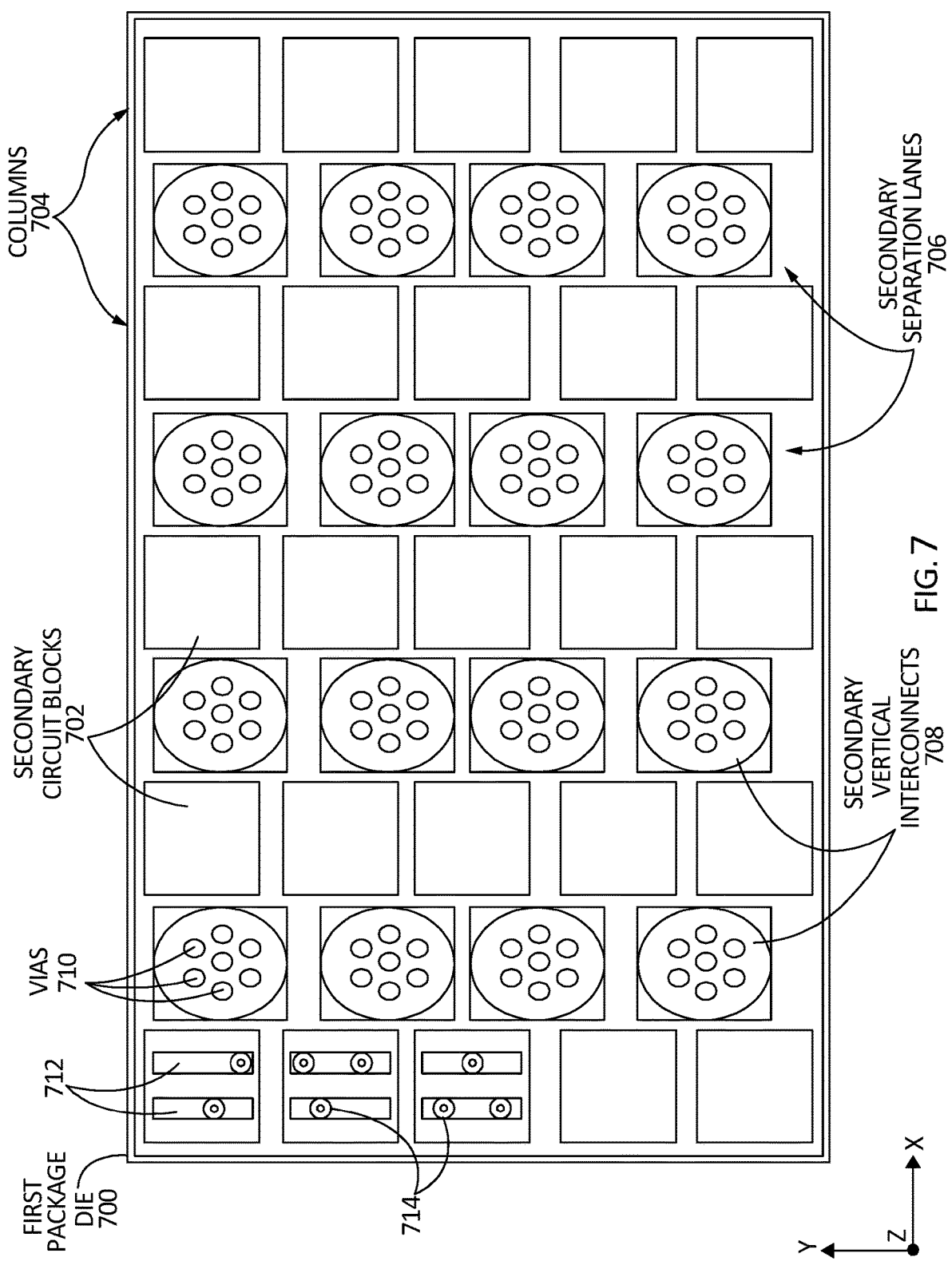
FIG. 7 is a plan view of an example of the first package die in FIG. 5, with the secondary circuit blocks separated by separation lanes through which vertical interconnects, including several vias, may extend.

FIG. 7 is a plan view of an example of a first package die 700 corresponding to the first package die 400 in FIG. 4, in which secondary circuit blocks 702 are disposed in columns 704 separated by secondary separation lanes 706, and secondary vertical interconnects 708 extend through the secondary separation lanes 706. FIG. 7 is provided to show that each of the secondary vertical interconnects 708 includes a plurality of vias 710. Since the secondary vertical interconnects 708 occupy more area, they only fit in the secondary separation lanes 706. A few examples of the primary separation lanes 712 within the secondary circuit blocks 702 are shown for comparison. Although FIG. 7 is not to scale, it clearly illustrates that the secondary vertical interconnects 708 may provide a greater number of vias 710 but are disposed at a much lower density and in far fewer total numbers than the primary vertical interconnects 714. It should be understood that although the first package die 700 includes the primary vertical interconnects 714 and secondary vertical interconnects 708, a first package die, according to the present disclosure, may alternatively include either the primary vertical interconnects 714 exclusively, or the secondary vertical interconnects 708 exclusively.

Figures 8A, 8B:
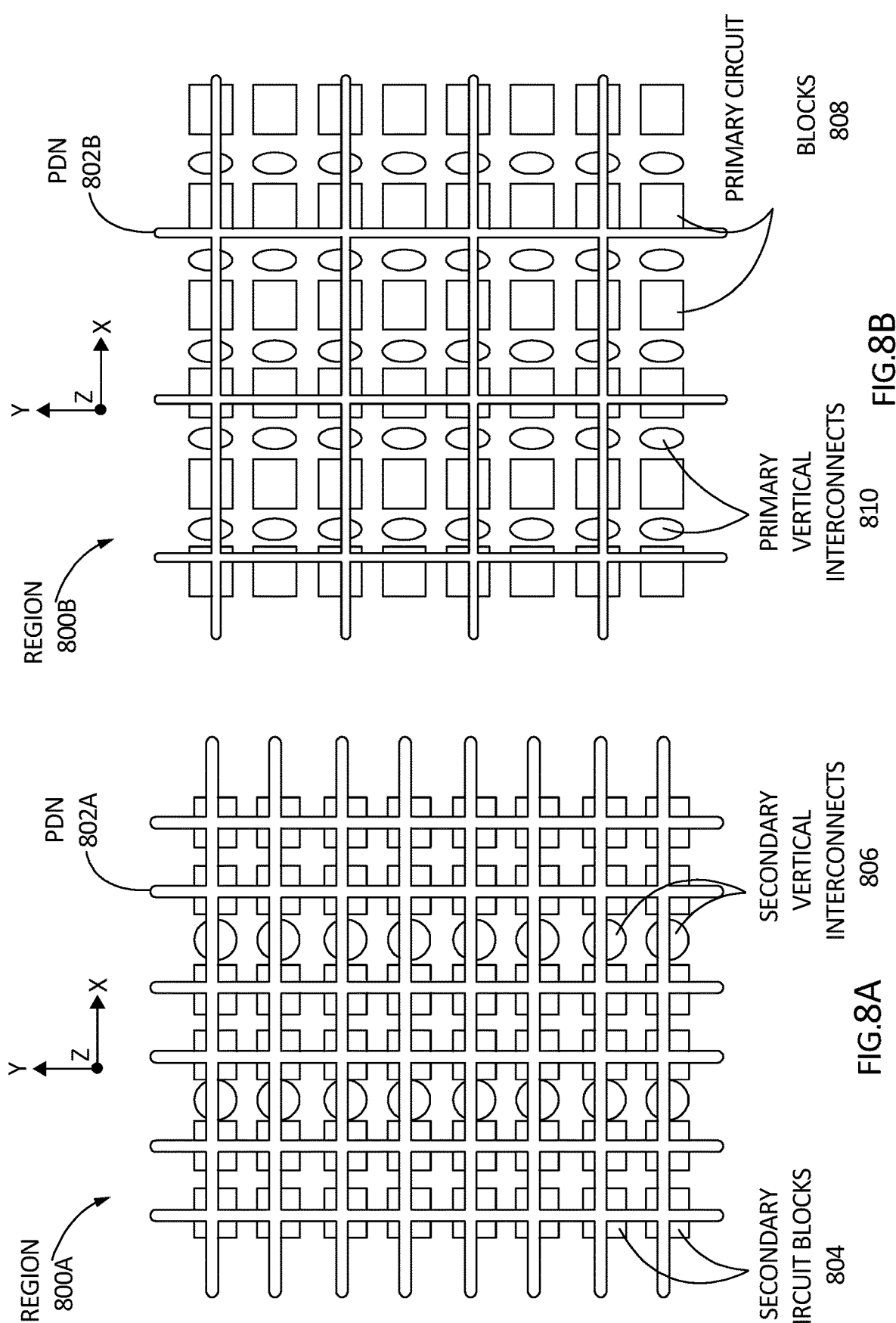
FIGS. 8A and 8B illustrate examples of regions of power distributions networks, circuit blocks, and vertical interconnects having coarse and fine pitches, respectively.

FIG. 8A is a plan view of a region 800A of a 3D IC in which a power distribution network (PDN) 802A in a second package die (not shown) (e.g., second package die 208 in FIG. 2) is superimposed on secondary circuit blocks 804 and secondary vertical interconnects 806. FIG. 8B is a plan view of another example region 800B of a 3D IC in which a PDN 802B of a second package die is superimposed on primary circuit blocks 808 and primary vertical interconnects 810. FIGS. 8A and 8B provide contrasting options for supplying current to the PDNs 802A, 802B in the second package die. As shown in FIG. 8A, the secondary vertical interconnects 806 provide a greater number of vias (see vias 710 in FIG. 7) but are more coarsely distributed than the primary vertical interconnects 810. FIG. 8B shows that, while having fewer vias (not shown) in each one, the primary vertical interconnects 810 are more abundant and evenly distributed. The type of PDN 802A, 802B used in a second package die, or even within a region of a second package die, can be adjusted according to space available in the first package die, the need for even power distribution in the second package die, such as due to hot-spots, and/or the total amount of power needed.

Electronic devices that include 3D IC packages with a first package die that includes vertical interconnects providing vias extending between a package substrate and a second package die for improved power distribution and reduced metal layer congestion, as shown in FIGS. 2, 5, 6, 7, 8A, and 8B and according to, but not limited to, the exemplary fabrication process in FIG. 3, and according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 9:
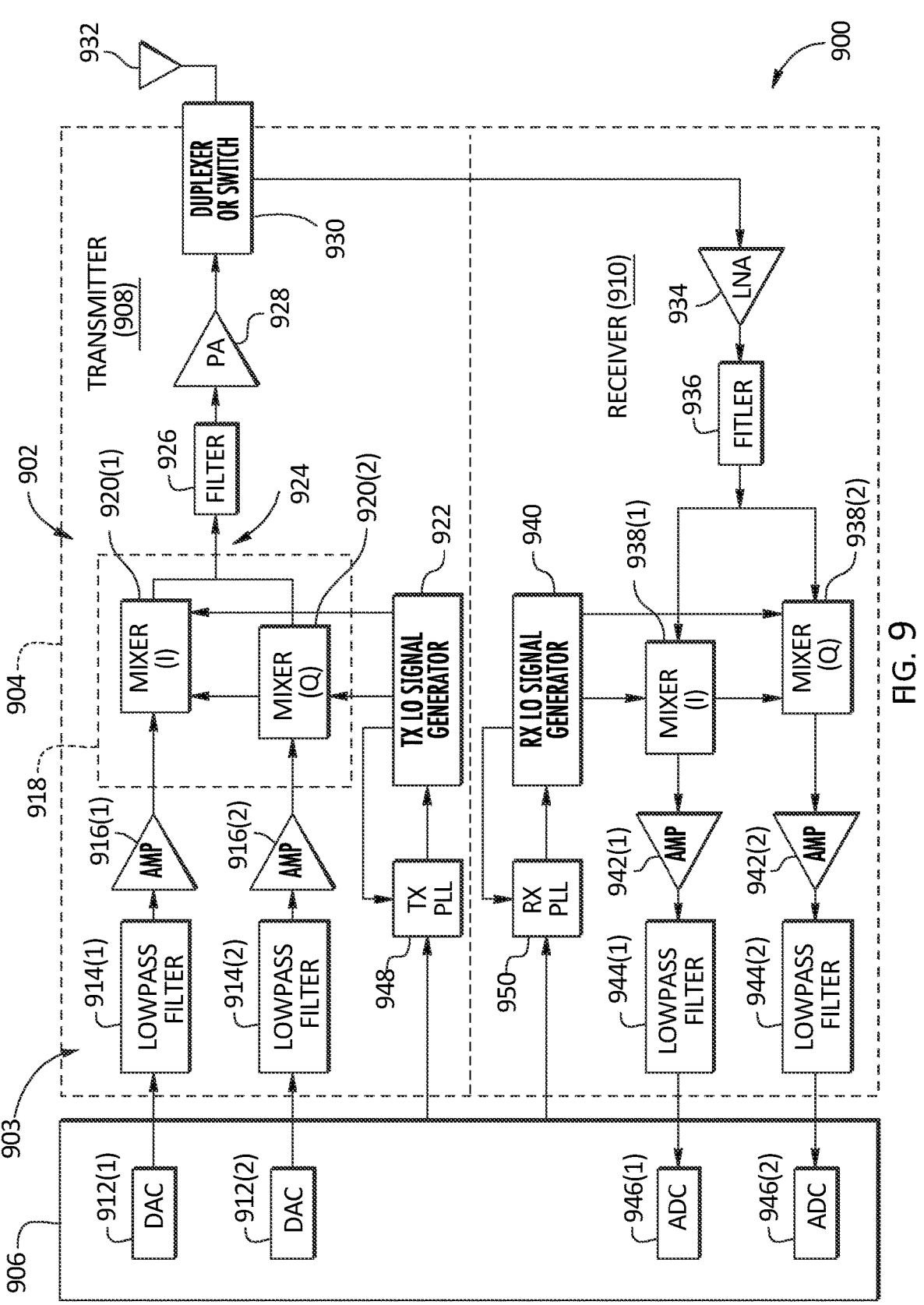
FIG. 9 is a block diagram of an exemplary processor-based system that can include 3D IC packages including exemplary package dies including vertical interconnects through a first package die and horizontal interconnects in a distribution layer to provide a low resistance path without increasing metallization layer congestion in FIGS. 1, 2, and 4-7, and according to, but not limited to, any of the exemplary fabrication processes in FIG. 3.

FIG. 9 illustrates an exemplary wireless communications device 900 that includes radio-frequency (RF) components formed from one or more ICs 902, wherein any of the ICs 902 can be included in the 3D IC package 903. The 3D IC package 903 can include a first package die that includes vertical interconnects providing vias extending between a package substrate and a second package die for improved power distribution and reduced metal layer congestion, as shown in FIGS. 2, 5, 6, 7, 8A, and 8B and according to any exemplary aspects disclosed herein. The wireless communications device 900 may include or be provided in any of the above-referenced devices as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals (e.g., I and Q output currents) for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency up-conversion and noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Down-conversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency up-conversion, while the RX LO signal generator 940 generates the I and Q RX LO signals used for frequency down-conversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Figure 10:
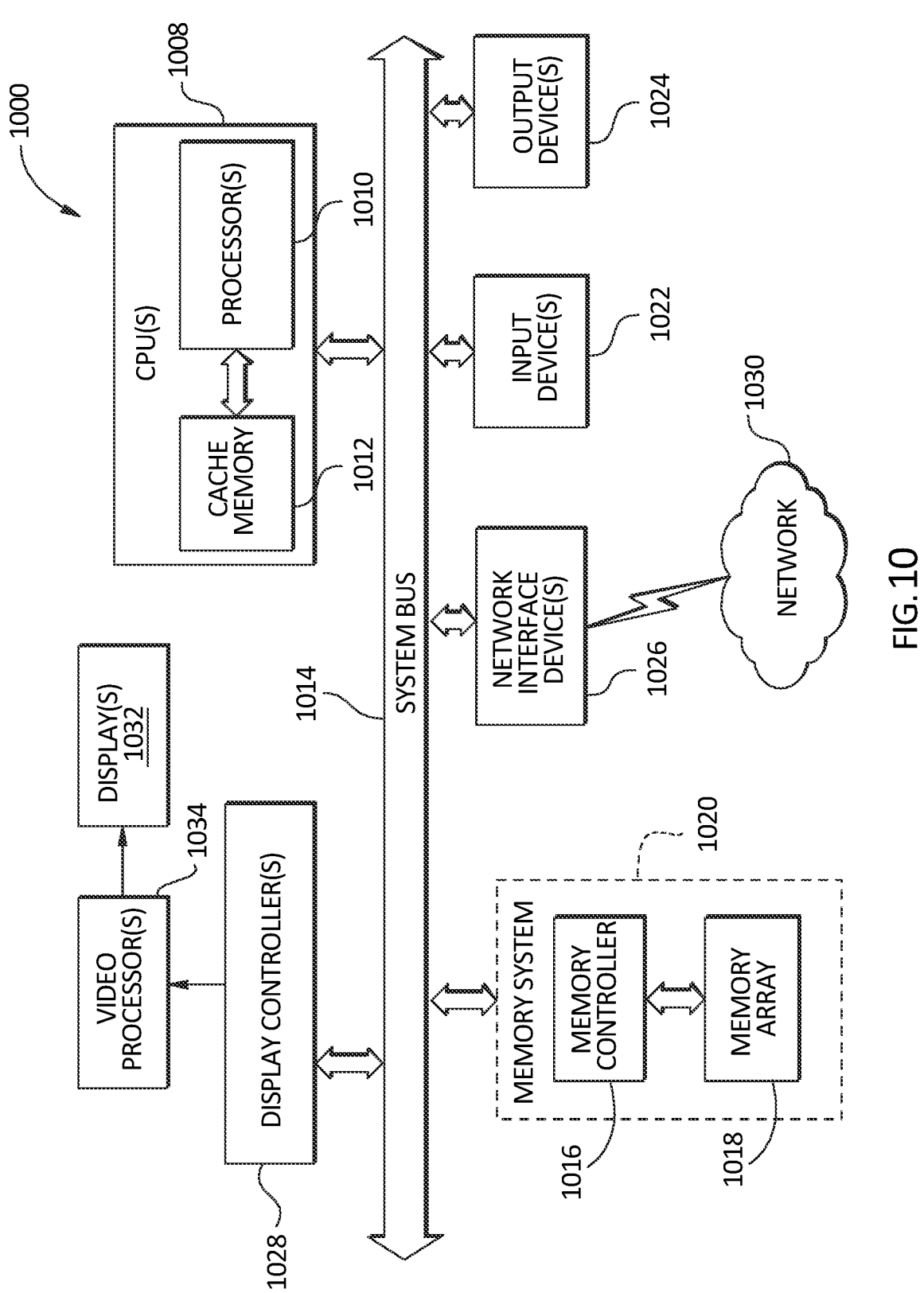
FIG. 10 is a block diagram of an exemplary wireless communication device that includes radio-frequency (RF) components that can include 3D IC packages, including exemplary package dies including vertical interconnects through a first package die and horizontal interconnects in a distribution layer to provide a low resistance path without increasing metallization layer congestion in FIGS. 1, 2, and 4-7, and according to, but not limited to, any of the exemplary fabrication processes in FIG. 3.

In this regard, FIG. 10 illustrates an example of a processor-based system 1000 that can include 3D IC packages with a first package die that includes vertical interconnects providing vias extending between a package substrate and a second package die for improved power distribution and reduced metal layer congestion as shown in FIGS. 2, 5, 6, 7, 8A, and 8B and according to any exemplary aspects disclosed herein. The processor-based system 1000 includes a central processing unit (CPU) 1008 that includes one or more processors 1010, which may also be referred to as CPU cores or processor cores. The CPU 1008 may have cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016, as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™M network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processor(s) 1034, which process the information to be displayed into a format suitable for the display(s) 1032. The display(s) 1032 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory, or another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A three-dimensional (3D) integrated circuit (IC) package, comprising:
   a first package die, comprising:
      a plurality of vertical interconnects extending through the first package die in a first direction between a first side of the first package die and a second side of the first package die;
      a distribution layer comprising horizontal interconnects extending in a second direction orthogonal to the first direction, the distribution layer disposed on metallization layers on the first side of the first package die and coupled to the plurality of vertical interconnects;
      first die contacts disposed on the first side of the first package die and coupled to the horizontal interconnects; and
      second die contacts disposed on the second side of the first package die, coupled to the plurality of vertical interconnects, and configured to couple to a second package die.

2. The 3D IC package of clause 1, the first package die, further comprising:
   a first semiconductor substrate, wherein the first side of the first package die comprises a first side of the first semiconductor substrate; and
   a first active circuit layer on the first side of the first semiconductor substrate, wherein the metallization layers are disposed on the first active circuit layer.

3. The 3D IC package of clause 2, wherein:
   each of the horizontal interconnects in the distribution layer couples to a corresponding metal trace in a first metallization layer of the metallization layers on the first side of the first package die; and
   each of the metal traces extends in a third direction, orthogonal to the second direction, and couples to one of the plurality of vertical interconnects.

4. The 3D IC package of clause 3, wherein at least one of the plurality of vertical interconnects extends between one of the second die contacts and one of the metal traces in the first metallization layer.

5. The 3D IC package of one of clause 3 and clause 4, wherein at least one of the plurality of vertical interconnects extends between one of the second die contacts and another metallization layer between the first metallization layer and the first active circuit layer.

6. The 3D IC package of any one of clause 1 to clause 5, wherein the first die contacts each comprise a portion of a horizontal interconnect in the distribution layer.

7. The 3D IC package of any one of clause 1 to clause 5, wherein each of the first die contacts comprises a contact coupled to a horizontal interconnect.

8. The 3D IC package of any one of clause 2 to clause 5, further comprising the second package die comprising a second active circuit layer coupled to the second die contacts on the second side of the first package die.

9. The 3D IC package of clause 8, the first active circuit layer comprising:

secondary circuit blocks, each comprising primary circuit blocks, wherein each of the primary circuit blocks comprises a memory array circuit;

primary separation lanes disposed between the primary circuit blocks within each of the secondary circuit blocks; and secondary separation lanes disposed between the secondary circuit blocks, wherein the secondary separation lanes are wider in width than the primary separation lanes.

10. The 3D IC package of clause 9, wherein the primary circuit blocks comprise static random-access memory (SRAM) circuits and/or dynamic random-access memory (DRAM) circuits.

11. The 3D IC package of one of clause 9 and clause 10, wherein the second active circuit layer is configured to receive power through a power distribution network (PDN) coupled to the second die contacts.

12. The 3D IC package of any one of clause 9 to clause 11, wherein the second active circuit layer comprises digital logic circuits configured to access the primary circuit blocks in the first active circuit layer.

13. The 3D IC package of any one of clause 9 to clause 12, wherein each vertical interconnect of the plurality of vertical interconnects comprises at least one through-silicon via (TSV).

14. The 3D IC package of clause 13, the plurality of vertical interconnects comprising primary vertical interconnects extending through the primary separation lanes in the first package die, wherein the at least one TSV in the primary vertical interconnects comprises less than four (4) TSVs.

15. The 3D IC package of one of clause 13 and clause 14, the plurality of vertical interconnects comprising secondary vertical interconnects extending through the secondary separation lanes in the first package die, wherein the at least one TSV in the secondary vertical interconnects comprises four (4) or more TSVs.

16. The 3D IC package of any one of clause 8 to clause 15, wherein:

the second package die is smaller in area than the first package die;

the first package die comprises:

an overlap area in which the second package die overlaps the second side of the first package die; and a non-overlap area outside the overlap area;

the second die contacts are disposed in the overlap area;

one of the first die contacts is disposed in the non-overlap area of the first package die; and a horizontal interconnect couples a primary vertical interconnect in the overlap area to the one of the first die contacts in the non-overlap area.

17. The 3D IC package of any one of clause 8 to clause 15, wherein:

the second package die is smaller in area than the first package die;

the first package die comprises:

an overlap area in which the second package die overlaps the second side of the first package die; and a non-overlap area outside the overlap area;

the second die contacts are disposed in the overlap area;

the first package die comprises a row of primary vertical interconnects disposed in the overlap area parallel to a perimeter of the overlap area; and the horizontal interconnects couple the row of primary vertical interconnects to the first die contacts in the non-overlap area.

18. The 3D IC package of clause 14, wherein:

the primary circuit blocks in one of the secondary circuit blocks are disposed in columns separated by one of the primary separation lanes;

each of the primary separation lanes comprises end regions and a central region disposed between the end regions; and the primary vertical interconnects extending through the primary separation lanes in one of the secondary circuit blocks extend through the end regions and not through the central region.

19. The 3D IC package of any one of clause 1 to clause 18 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

20. A method of fabricating a three-dimensional (3D) integrated circuit (IC) package, comprising forming a first package die, comprising:

forming a plurality of vertical interconnects extending through the first package die in a first direction between a first side of the first package die and a second side of the first package die;

forming a distribution layer comprising horizontal interconnects extending in a second direction orthogonal to the first direction, the distribution layer disposed on metallization layers on the first side of the first package die and coupled to the plurality of vertical interconnects;

forming first die contacts disposed on the first side of the first package die and coupled to the horizontal interconnects; and forming second die contacts disposed on the second side of the first package die, coupled to the plurality of vertical interconnects, and configured to couple to a second package die.

21. The method of clause 20, wherein forming the plurality of vertical interconnects further comprises forming vias coupled to one of the first die contacts and one of the second die contacts.

22. The method of clause 21, wherein forming the first package die further comprises:

forming a first active circuit layer;

forming the metallization layers on the first active circuit layer; and forming metal traces in a first metallization layer of the metallization layers, wherein the metal traces couple the horizontal interconnects to the vias.

23. The method of clause 22, wherein forming the plurality of vertical interconnects further comprises forming the plurality of vertical interconnects between circuit blocks in the first active circuit layer.

What is claimed is:

1. A three-dimensional (3D) integrated circuit (IC) package, comprising a first package die, comprising:

a plurality of vertical interconnects extending through the first package die in a first direction between a first side of the first package die and a second side of the first package die;

a distribution layer comprising horizontal interconnects extending in a second direction orthogonal to the first direction, the distribution layer disposed on metallization layers on the first side of the first package die and coupled to the plurality of vertical interconnects;

first die contacts disposed on the first side of the first package die and coupled to the horizontal interconnects;

second die contacts disposed on the second side of the first package die, coupled to the plurality of vertical interconnects, and configured to couple to a second package die;

a first semiconductor substrate, wherein the first side of the first package die comprises a first side of the first semiconductor substrate; and a first active circuit layer on the first side of the first semiconductor substrate and comprising:

secondary circuit blocks, each comprising primary circuit blocks, wherein each of the primary circuit blocks comprises a memory array circuit;

primary separation lanes disposed between the primary circuit blocks within each of the secondary circuit blocks; and secondary separation lanes disposed between the secondary circuit blocks, wherein:

the secondary separation lanes are wider than the primary separation lanes; and the metallization layers are disposed on the first active circuit layer.

2. The 3D IC package of claim 1, wherein:

each of the horizontal interconnects in the distribution layer couples to a corresponding metal trace in a first metallization layer of the metallization layers on the first side of the first package die; and each of the metal traces extends in a third direction, orthogonal to the second direction, and couples to one of the plurality of vertical interconnects.

3. The 3D IC package of claim 2, wherein at least one of the plurality of vertical interconnects extends between one of the second die contacts and one of the metal traces in the first metallization layer.

4. The 3D IC package of claim 2, wherein at least one of the plurality of vertical interconnects extends between one of the second die contacts and another metallization layer between the first metallization layer and the first active circuit layer.

5. The 3D IC package of claim 1, wherein the first die contacts each comprise a portion of a horizontal interconnect in the distribution layer.

6. The 3D IC package of claim 1, wherein each of the first die contacts comprises a contact coupled to a horizontal interconnect.

7. The 3D IC package of claim 1, further comprising the second package die comprising a second active circuit layer coupled to the second die contacts on the second side of the first package die.

8. The 3D IC package of claim 7, wherein:

the second package die is smaller in area than the first package die;

the first package die comprises:

an overlap area in which the second package die overlaps the second side of the first package die; and a non-overlap area outside the overlap area;

the second die contacts are disposed in the overlap area;

one of the first die contacts is disposed in the non-overlap area of the first package die; and a horizontal interconnect couples a primary vertical interconnect in the overlap area to the one of the first die contacts in the non-overlap area.

9. The 3D IC package of claim 7, wherein:

the second package die is smaller in area than the first package die;

the first package die comprises:

an overlap area in which the second package die overlaps the second side of the first package die; and a non-overlap area outside the overlap area;

the second die contacts are disposed in the overlap area;

the first package die comprises a row of primary vertical interconnects disposed in the overlap area parallel to a perimeter of the overlap area; and the horizontal interconnects couple the row of primary vertical interconnects to the first die contacts in the non-overlap area.

10. The 3D IC package of claim 1, wherein the primary circuit blocks comprise static random-access memory (SRAM) circuits and/or dynamic random-access memory (DRAM) circuits.

11. The 3D IC package of claim 1, wherein the second active circuit layer is configured to receive power through a power distribution network (PDN) coupled to the second die contacts.

12. The 3D IC package of claim 1, wherein the second active circuit layer comprises digital logic circuits configured to access the primary circuit blocks in the first active circuit layer.

13. The 3D IC package of claim 1, wherein each vertical interconnect of the plurality of vertical interconnects comprises at least one through-silicon via (TSV).

14. The 3D IC package of claim 13, the plurality of vertical interconnects comprising primary vertical interconnects extending through the primary separation lanes in the first package die, wherein the at least one TSV in the primary vertical interconnects comprises less than four (4) TSVs.

15. The 3D IC package of claim 13, the plurality of vertical interconnects comprising secondary vertical interconnects extending through the secondary separation lanes in the first package die, wherein the at least one TSV in the secondary vertical interconnects comprises four (4) or more TSVs.

16. The 3D IC package of claim 14, wherein:

the primary circuit blocks in one of the secondary circuit blocks are disposed in columns separated by one of the primary separation lanes;

each of the primary separation lanes comprises end regions and a central region disposed between the end regions; and the primary vertical interconnects extending through the primary separation lanes in one of the secondary circuit blocks extend through the end regions and not through the central region.

17. The 3D IC package of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

18. A method of fabricating a three-dimensional (3D) integrated circuit (IC) package, comprising forming a first package die, comprising:

forming a plurality of vertical interconnects extending through the first package die in a first direction between a first side of the first package die and a second side of the first package die;

forming a distribution layer comprising horizontal interconnects extending in a second direction orthogonal to the first direction, the distribution layer disposed on metallization layers on the first side of the first package die and coupled to the plurality of vertical interconnects;

forming first die contacts disposed on the first side of the first package die and coupled to the horizontal interconnects;

forming second die contacts disposed on the second side of the first package die, coupled to the plurality of vertical interconnects, and configured to couple to a second package die;

forming a first semiconductor substrate, wherein the first side of the first package die comprises a first side of the first semiconductor substrate; and forming a first active circuit layer on the first side of the first semiconductor substrate and comprising:

secondary circuit blocks, each comprising primary circuit blocks, wherein each of the primary circuit blocks comprises a memory array circuit;

primary separation lanes disposed between the primary circuit blocks within each of the secondary circuit blocks; and secondary separation lanes disposed between the secondary circuit blocks, wherein:

the secondary separation lanes are wider than the primary separation lanes; and the metallization layers are disposed on the first active circuit layer.

19. The method of claim 18, wherein forming the plurality of vertical interconnects further comprises forming vias coupled to one of the first die contacts and one of the second die contacts.

20. The method of claim 19, wherein forming the first package die further comprises:

forming a first active circuit layer;

forming the metallization layers on the first active circuit layer; and forming metal traces in a first metallization layer of the metallization layers, wherein the metal traces couple the horizontal interconnects to the vias.

21. The method of claim 20, wherein forming the plurality of vertical interconnects further comprises forming the plurality of vertical interconnects between circuit blocks in the first active circuit layer.

* * * * *